United States Patent
Morita et al.

(10) Patent No.: US 9,346,989 B2
(45) Date of Patent: *May 24, 2016

(54) PAINTABLE DIFFUSING AGENT COMPOSITION

(75) Inventors: Toshiro Morita, Kawasaki (JP); Takashi Kamizono, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 1157 days.

This patent is subject to a terminal disclaimer.

(21) Appl. No.: 13/302,076

(22) Filed: Nov. 22, 2011

(65) Prior Publication Data

US 2012/0132109 A1    May 31, 2012

(30) Foreign Application Priority Data

Nov. 25, 2010  (JP) .................................. 2010-262967

(51) Int. Cl.
| | | |
|---|---|---|
| C09D 183/06 | (2006.01) | |
| C09J 183/04 | (2006.01) | |
| C09J 183/06 | (2006.01) | |
| C09D 11/30 | (2014.01) | |
| H01L 21/22 | (2006.01) | |
| H01L 21/288 | (2006.01) | |
| H01L 31/18 | (2006.01) | |
| H01L 31/068 | (2012.01) | |

(52) U.S. Cl.
CPC ............... *C09J 183/04* (2013.01); *C09D 11/30* (2013.01); *C09D 183/06* (2013.01); *C09J 183/06* (2013.01); *H01L 21/2225* (2013.01); *H01L 21/288* (2013.01); *H01L 31/0682* (2013.01); *H01L 31/1804* (2013.01); *Y02E 10/547* (2013.01); *Y02P 70/521* (2015.11)

(58) Field of Classification Search
CPC ....... C09J 183/04; C09J 183/06; Y02E 10/50; C09D 183/04; C09D 183/06; H01L 21/2225; H01L 21/228

See application file for complete search history.

(56) References Cited

U.S. PATENT DOCUMENTS

| | | | | |
|---|---|---|---|---|
| 8,324,089 | B2* | 12/2012 | Leung et al. .................. | 438/563 |
| 2003/0077059 | A1* | 4/2003 | Chien ................... | C03C 25/106 385/128 |
| 2009/0239363 | A1* | 9/2009 | Leung et al. .................. | 438/562 |
| 2011/0017291 | A1* | 1/2011 | Morita et al. ................. | 136/256 |

FOREIGN PATENT DOCUMENTS

| | | |
|---|---|---|
| JP | 2003-168810 | 6/2003 |
| JP | 2003-332606 | 11/2003 |
| JP | 2006-156646 | 6/2006 |
| TW | 200947528 A | 11/2009 |
| WO | WO 2009/120437 A1 | 10/2009 |

OTHER PUBLICATIONS

"Material Safety Data Sheet: B-30, B-40, B-50, B-60 Spin-on Dopants", Honeywell (Apr. 2003), pp. 1-7.*
Office Action in Chinese Patent Application No. 201110378630.9, issued Dec. 22, 2014.
Office Action in Taiwanese Patent Application No. 100140928, date May 25, 2015.

* cited by examiner

*Primary Examiner* — David M Brunsman
(74) *Attorney, Agent, or Firm* — Knobbe Martens Olson & Bear LLP

(57) ABSTRACT

A diffusing agent composition of an aspect of the invention contains: a condensation product (A) made from a starting material that is an alkoxysilane represented by the following general formula (1):
[Chemical Formula 1]

$$R^1{}_m Si(OR^2)_{4-m} \qquad (1)$$

where $R^1$ and $R^2$ are an organic group,
a plurality of $R^1$s and $R^2$s included in condensation product are identical or different, and m is 0, 1 or 2,
the condensation product including an alkoxysilane where m=0 also including at least one alkoxysilane where m is 1 or 2; an impurity diffusion component (C); and an organic solvent (D).

4 Claims, 1 Drawing Sheet

PAINTABLE DIFFUSING AGENT COMPOSITION

BACKGROUND OF THE INVENTION

1. Field of the Invention

The present invention relates to a paintable diffusing agent composition containing an impurity diffusion component for being diffused into a semiconductor substrate. Specifically, the invention relates to a diffusing agent composition suitable for being patterned onto a semiconductor substrate surface in an ink-jet method.

2. Description of the Related Art

According to the related art, an N-type impurity diffusion layer in a semiconductor substrate of a solar cell is formed by applying a diffusing agent that contains an N-type impurity diffusion component to a surface of the semiconductor substrate, and causing the N-type impurity diffusion component to diffuse from the applied diffusing agent. Specifically, a thermally oxidized film is first formed on a surface of a semiconductor substrate, and subsequently a photolithographic method is used to laminate a resist having a predetermined pattern onto the thermally oxidized film. The resist is used as a mask to etch, with an acid or alkali, regions of the thermally oxidized film that are not masked by the resist, and then the resist is peeled to form a mask of the thermally oxidized film. A diffusing agent which contains an N-type impurity diffusion component is applied thereto, thereby forming a diffusion film in regions in which openings in the mask are positioned. The regions are heated to a high temperature to cause the diffusing agent to diffuse into the regions, thereby forming an N-type impurity diffusion layer.

In recent years, suggestions have been made about methods of using an ink-jet method to pattern a surface of a semiconductor substrate with a diffusing agent into (see, for example, Patent Literature 1, Patent Literature 2, and Patent Literature 3). In the ink-jet method, the diffusing agent is jetted from ink-jet nozzles to an impurity diffusion layer region for selective patterning. Thus, as compared with conventional photolithographic methods, the ink-jet method does not require any complicated step, and makes it possible to make a pattern easily while also reducing the amount of liquid to be used.

CITATION LIST

Patent Literatures

Patent Literature 1: JP-A-2003-168810
Patent Literature 2: JP-A-2003-332606
Patent Literature 3: JP-A-2006-156646

When a conventional paintable diffusing agent is painted onto a substrate having steps each giving a level difference of several micrometers, such as a silicon wafer for a solar cell, the painting liquid (i.e., the liquid containing the agent) remains in concaves which create the steps. When the substrate is fired to diffuse the diffusing component into the substrate, the remaining diffusing agent is shrunken so that the resultant film is cracked. When the painting liquid is made into a thin film not to cause any crack in the film, in other words, when the concentration of the painting is made low, there arises a problem that a film having a sufficient thickness is not obtained on a shoulder region (slope region) of each of the steps.

SUMMARY OF THE INVENTION

In light of such problems, the invention has been made. An object of the invention is to provide a technique about a paintable diffusing agent composition containing an impurity diffusion component which makes it possible that when the composition is painted onto a semiconductor substrate, a film having a sufficient thickness is obtained, and which does not cause a crack easily in the film when the substrate is fired to diffuse the agent into the substrate.

An aspect of the invention is a paintable diffusing agent composition. The diffusing agent composition is a diffusing agent composition used to diffuse an impurity diffusion component into a semiconductor substrate. The diffusing agent composition contains a condensation product (A) made from a starting material that is an alkoxysilane represented by the following general formula (1), an impurity diffusion component (C), and an organic solvent (D):

[Chemical Formula 1]

$$R^1_m Si(OR^2)_{4-m} \tag{1}$$

where $R^1$ and $R^2$ are an organic group, a plurality of $R^1$s and $R^2$s included in condensation product are identical or different, and m is 0, 1 or 2, the condensation product including an alkoxysilane where m=0 also including at least one alkoxysilane where m is 1 or 2.

The diffusing agent composition of this aspect makes it possible that a sufficient painted film thickness is obtained, and when the composition is painted onto a substrate having steps and then the substrate is fired to diffuse the impurity diffusion component, the painted film is not easily cracked.

DETAILED DESCRIPTION OF THE INVENTION

Figure 1A:
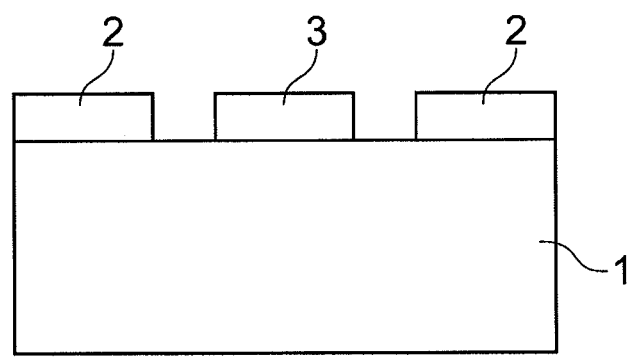
FIG. 1A to FIG. 1C are each a process sectional view referred to in order to describe a method for forming an impurity diffusion layer according to an embodiment of the invention.

The invention will now be described by reference to the preferred embodiments. This does not intend to limit the scope of the present invention, but to exemplify the invention.

A diffusing agent composition according to one of the embodiments is used to diffuse an impurity into a semiconductor substrate. The diffusing agent composition according to the embodiment is suitably used, in particular, when a semiconductor substrate is selectively patterned with a painting liquid using an ink-jet method. The semiconductor substrate may be used as a substrate for a solar cell.

The diffusing agent composition according to the embodiment contains a condensation product (A) made from a starting material that is an alkoxysilane, an impurity diffusion component (C), and an organic solvent (D) as essential components, and further contains a condensation product (B) as an optional component. The diffusing agent composition according to the embodiment is suitable, in particular, for being painted onto a substrate having steps each having a level difference of 0.5 μm or more using an ink-jet method. Hereinafter, each of the components contained in the diffusing agent composition will be described in detail.

(A) Condensation Product:

The condensation product (A) is a reaction product made from a starting material that is an alkoxysilane represented by the following general formula (1), and obtained by hydrolyzing the alkoxysilane:

[Chemical Formula 2]

$$R^1_m Si(OR^2)_{4-m} \tag{1}$$

wherein $R^1$ and $R^2$ are each an organic group, each of a plurality of $R^1$s or $R^2$s may be the same or different from each other, and m is 0, 1 or 2, provided that when m is 0, the condensation product (A) is made from plural alkoxysilanes each represented by the general formula (1) and indispensably contains an alkoxysilane represented by the general formula (1) wherein m is 1 or 2.

When m in the general formula (1) is 0, a silane compound (i) as the alkoxysilane is represented by the following general formula (2):

$$Si(OR^{51})_a(OR^{52})_b(OR^{53})_c(OR^{54})_d \tag{2}$$

wherein $R^{51}$, $R^{52}$, $R^{53}$ and $R^{54}$ each independently represent the same organic group as defined for $R^2$; and a, b, c and d are each an integer satisfying the following: $0 \leq a \leq 4$, $0 \leq b \leq 4$, $0 \leq c \leq 4$, and $0 \leq d \leq 4$, and a+b+c+d=4.

When m in the general formula (1) is 1, a silane compound (ii) as the alkoxysilane is represented by the following general formula (3):

$$R^{65}Si(OR^{66})_e(OR^{67})_f(OR^{68})_g \tag{3}$$

wherein $R^{65}$ represents the same organic group as defined for $R^1$; $R^{66}$, $R^{67}$, and $R^{68}$ each independently represent the same organic group as defined for $R^2$; and e, f, and g are each an integer satisfying the following: $0 \leq e \leq 3$, $0 \leq f \leq 3$, and $0 \leq g \leq 3$, and e+f+g=3.

When m in the general formula (1) is 2, a silane compound (iii) as the alkoxysilane is represented by the following general formula (4):

$$R^{70}R^{71}Si(OR^{72})_h(OR^{73})_i \tag{4}$$

wherein $R^{70}$ and $R^{71}$ each independently represent the same organic group as defined for $R^1$; $R^{72}$ and $R^{73}$ each independently represent the same organic group as defined for $R^2$; and h and i are each an integer satisfying the following: $0 \leq h \leq 2$, and $0 \leq i \leq 2$, and h+i=2.

The condensation product (A) may be prepared by a method of hydrolyzing one or more selected from the above-mentioned silane compounds (i) to (iii) in the presence of an acid catalyst, water, and an organic solvent. Specifically, the silane compound (i) is indispensably hydrolyzed together with the silane compound (ii) or (iii).

The acid catalyst may be an organic acid, or an inorganic acid. The inorganic acid may be, for example, sulfuric acid, phosphoric acid, nitric acid or hydrochloric acid, and is preferably phosphoric acid or nitric acid. The organic acid may be a carboxylic acid such as formic acid, oxalic acid, fumaric acid, maleic acid, glacial acetic acid, acetic anhydride, propionic acid, or n-butyric acid, or an organic acid having a sulfur-containing-acid residue. The organic acid having a sulfur-containing-acid residue may be, for example, an organic sulfonic acid. An esterified product thereof may be used, examples thereof including organic sulfates and organic sulfites. Of these examples, an organic sulfonic acid, for example, a compound represented by the following general formula (5) is particularly preferred:

$$R^{13}-X \tag{5}$$

wherein $R^{13}$ is a hydrocarbon group which may have a substituent, and X is a sulfonic acid group.

In the general formula (5), the hydrocarbon group as $R^{13}$ is preferably a hydrocarbon group having 1 to 20 carbon atoms. This hydrocarbon group may be a saturated or unsaturated group, and may be any one of linear, branched and cyclic groups. When the hydrocarbon group as $R^{13}$ is cyclic, the group is preferably, for example, an aromatic hydrocarbon group such as a phenyl, naphthyl or anthryl group, and is in particular preferably a phenyl group. In this aromatic hydrocarbon group, it is allowable to bond, to the aromatic ring thereof, one or more hydrocarbon group having 1 to 20 carbon atoms as one or more substituents. The hydrocarbon group as the substituent on the aromatic ring may be a saturated or unsaturated group, and may be any one of linear, branched and cyclic groups. The hydrocarbon group as $R^{13}$ may have one or more substituents. Examples of the substituent include halogen atoms such as fluorine atoms; and sulfonic acid, carboxyl, hydroxyl, amino, and cyano groups.

The acid catalyst acts as a catalyst when the alkoxysilane is hydrolyzed in the presence of water. The amount of the used acid catalyst is preferably adjusted to set the catalyst concentration in the reaction system for the hydrolysis reaction into the range of 1 to 1000 ppm, in particular, into that of 5 to 800 ppm. In accordance with the addition amount of water, the hydrolysis rate of the siloxane polymer is varied; thus, the amount is decided, correspondingly to the hydrolysis rate to be attained.

Examples of the organic solvent in the reaction system for the hydrolysis reaction include monohydric alcohols such as methanol, ethanol, propanol, isopropanol (IPA), and n-butanol; alkyl carbonates such as methyl 3-methoxypropionate, and ethyl 3-ethoxypropionate; polyhydric alcohols such as ethylene glycol, diethylene glycol, propylene glycol, glycerin, trimethylolpropane, and hexanetriol; monoethers of a polyhydric alcohol, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether and propylene glycol monobutyl ether, and a monoacetate of any one of these compounds; esters such as methyl acetate, ethyl acetate, and butyl acetate; ketones such as acetone, methyl ethyl ketone, and methyl isoamyl ketone; polyhydric alcohol ethers each obtained by alkyl-etherizing all hydroxyl groups of a polyhydric alcohol, such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, and diethylene glycol methyl ethyl ether. These organic solvents may be used alone or in combination of two or more thereof.

In such a reaction system, the alkoxysilane is hydrolyzed to yield the condensation product (A). The hydrolysis reaction is completed usually in a period of about 5 to 100 hours. In order to make the reaction period short, it is preferred to heat the system into the range of temperatures not higher than 80° C.

After the end of the reaction, a reaction solution is yielded which contains the synthesized condensation product (A) and the organic solvent used for the reaction. The condensation product (A) can be obtained by the above-mentioned method in the state that the polymer is separated from the organic solvent in a conventionally known manner, and is in a dry solid form or in the form of a solution wherein the solvent is optionally substituted with another solvent.

The condensation product (A) contains a structure represented by the following general formula (6):

[Chemical Formula 3]

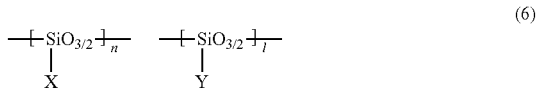

(6)

wherein X is an alkoxy group, Y is an organic group, and the ratio of n:1 ranges from 95:5 to 0:100. Y may be an alkyl, aryl or epoxy group, or a group represented by —$R^3$—$R^4$ wherein $R^4$ is an aryl group, or a group containing an ethylenically unsaturated double bond, and $R^3$ is an alkylene group having 1 to 9 carbon atoms, when each of a plurality of Xs or Ys may be the same or different from each other; and the structure may have $R^3$ different from each other.

In the condensation product (A), the alkoxy group as X may be an alkoxy group having 1 to 10 carbon atoms, and is preferably an alkoxy group having 1 to 5 carbon atoms. Examples thereof include methoxy, ethoxy, n-propoxy, iso-propoxy, n-butoxy, and tert-butoxy groups. The alkoxy group is more preferably a methoxy group.

In the condensation product (A), the alkyl group as Y may be an alkyl group having 1 to 10 carbon atoms, and examples thereof include linear alkyl groups such as methyl, ethyl, propyl, butyl, pentyl, hexyl, heptyl, octyl, nonyl, and decyl groups; branched alkyl groups such as 1-methylethyl, 1-methylpropyl, 2-methylpropyl, 1-methylbutyl, 2-methylbutyl, 3-methylbuytl, 1-ethylbutyl, 2-ethylbutyl, 1-methylpentyl, 2-methylpentyl, 3-methylpentyl, and 4-methylpentyl groups; and cyclic alkyl groups such as cyclopentyl, cyclohexyl, adamanthyl, norbornyl, isobornyl, and tricyclodecanyl groups. The alkyl group is preferably an alkyl group having 1 to 5 carbon atoms, more preferably an alkyl group having 1 to 3 carbon atoms, in particular preferably a methyl group.

In the condensation product (A), the aryl group as Y may be phenyl, biphenyl, fluorenyl, naphthyl, anthryl, and phenanthryl groups. The aryl group is preferably a phenyl group. The aryl group as Y may have a substituent such as alkyl, alkoxy or hydroxyl group. Examples of the alkyl group as the substituent of the aryl group as Y include the same as described as the examples of the alkyl group as Y. Examples of the alkoxy group as the substituent of the aryl group as Y include the same as described as the examples of the alkoxy group as X.

In the condensation product (A), the epoxy group as Y may be an epoxy group having 3 to 10 carbon atoms, and is preferably an epoxy group having 3 to 7 carbon atoms.

In the condensation product (A), the alkylene group having 1 to 9 carbon atoms as $R^3$ may be a linear or branched alkylene group, and is preferably a linear alkylene group having 1 to 7 carbon atoms, more preferably a linear alkylene group having 1 to 5 carbon atoms, in particular preferably a methylene, ethylene or n-propylene group.

In the condensation product (A), the group having an ethylenically unsaturated double bond as $R^4$ is preferably a group having, at its terminal, an ethylenically unsaturated double bond, in particular preferably a group represented by the following formula:

[Chemical Formula 4]

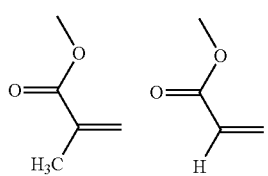

In the condensation product (A), examples of the aryl group as $R^4$ are the same as described as the examples of the aryl group as Y.

In the condensation product (A), Y is preferably an aryl group or a group represented by —$R^3$—$R^4$ since the condensation product (A) is excellent in storage stability in particular in the solution.

(B) Condensation Product:

The condensation product (B) is a reaction product made from a starting material that is an alkoxysilane represented by the following general formula (7), and is obtained by hydrolyzing the alkoxysilane represented by the general formula (7) in the same manner as used to obtain the condensation product (A).

[Chemical Formula 5]

$$Si(OR^5)_4 \qquad (7)$$

wherein $R^5$ is an organic group, and a plurality of $R^5$s may be the same or different.

Examples of the alkoxysilane represented by the general formula (7) include the same as described as the examples of the silane compound (i), wherein m is 0 in the general formula (1).

Specific examples of the alkoxysilane represented by the general formula (7) include tetraalkoxysilanes such as tetramethoxysilane, tetraethoxysilane, tetrapropoxysilane, tetrabutoxysialne, tetrapentyloxysialne, tetraphenyloxysilane, trimethoxymonoethoxysilane, dimethoxydiethoxysilane, triethoxymonomethoxysilane, trimethoxymonopropoxysialne, monomethoxytributoxysilane, monomethoxytripentyloxysialne, monomethoxytriphenylsilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysialne, diethoxymonopropoxymonobutoxysilane, dipropoxymonomethoxymonoethoxysilane, dipropoxymonomethoxymonobutoxysilane, dipropoxymonoethoxymonobutoxysialne, dibutoxymonomethoxymonoethoxysilane, dibutoxymonoethoxymonopropoxysilane, and monomethoxymonoethoxymonopropoxymonobutoxysilane. Tetramethoxysilane and tetraethoxysilane are particularly preferred.

The ratio of the $SiO_2$-converted mass (A:B) of the condensation product (A) to that of the condensation product (B) is preferably from 100:0 to 5:95. The "$SiO_2$-converted-mass ratio" is a ratio of $SiO_2$ converted mass in the condensation product (A) to $SiO_2$ converted mass in the condensation product (B). The "$SiO_2$-converted mass" of each of the condensation products is a value obtained by converting the amount of the entire Si component contained in each of the condensation products into the mass of $SiO_2$. In short, the condensation product (A) is an indispensable constituting component while the condensation product (B) is an optional component. However, it is not preferred that the proportion by mass of the condensation product (B) is more than 95% since advantageous effects of the condensation product (A) are unfavorably decreased. It is preferred that the diffusing agent composition of the invention contains both of the condensation products (A) and (B) since the addition of the condensation product (A) to the condensation product (B) makes it possible to improve the impurity diffusing power of the diffusing agent composition. The ratio of the $SiO_2$-converted mass (A:B) is more preferably from 85:15 to 10:90, most preferably from 65:35 to 20:80.

(C) Impurity Diffusion Component:

The impurity diffusion component (C) is a compound used ordinarily as a dopant for the production of a solar cell. The impurity diffusion component (C) is an N-type or P-type impurity diffusion component containing a compound of an element in the Group III (the Group 13) or the Group V (the Group 15). In the step of forming an electrode in a solar cell, the impurity diffusion component (C) makes it possible to form an N-type or P-type impurity diffusion layer (impurity diffusion region) in a semiconductor substrate. Examples of the Group-V-element compound, which is contained in the impurity diffusion component (C), include $P_2O_5$, $Bi_2O_3$, $Sb(OCH_2CH_3)_3$, $SbCl_3$, $As(OC_4H_9)_3$, and phosphates such as dibutyl phosphate, monobutyl phosphate, diethyl phosphate, monoethyl phosphate, dimethyl phosphate, and monomethyl phosphate. The concentration of the impurity diffusion component (C) is appropriately adjusted in accordance with the layer thickness of the impurity diffusion layer to be formed in a semiconductor substrate. Examples of the Group-III-element compound include $B_2O_3$, borate ester such as trioctyl borate, and $Al_2O_3$.

The ratio of the total of the $SiO_2$-converted mass of the condensation product (A) and that of the condensation product (B) to the impurity-atom-converted mass of the impurity diffusion component (C) ranges preferably from 95:5 to 50:50, more preferably from 85:15 to 60:40. When the proportion of the impurity-atom-converted mass is more than the lower limit, the diffusing agent composition exhibits a good diffusing performance. When the proportion is less than the upper limit, no residue of the organic component in the diffusing agent is generated after the thermal diffusing treatment.

The diffusing agent composition of the present embodiment may contain, as other components, a surfactant, a solvent component, and any additive. When the composition contains a surfactant, the composition can be improved in paintability, flattenability and developability, and in a diffusing agent composition layer formed after the painting thereof the generation of unevenness in the painted layer-tissue can be reduced. The surfactant may be a surfactant conventionally known, and is preferably a silicone surfactant. The surfactant is contained in the diffusing agent composition in a proportion ranging preferably from 100 to 10000 parts by mass, more preferably from 300 to 5000 parts by mass, even more preferably from 500 to 3000 parts by mass per million of the whole of the diffusing agent composition. Even more preferably, the proportion is 2000 or less parts by mass per million thereof since the diffusing agent composition layer is excellent in peelability after the layer is subjected to diffusing treatment. About the surfactant, a single species thereof may be used, or a combination of two or more species thereof may be used. The condensation product (A) in the invention is distinguished from any silicone surfactant in addition amount or advantageous effect, and is present as a constituting component different from any silicone surfactant in the composition.

The solvent component is not particularly limited, and examples thereof include alcohols such as methanol, ethanol, isopropanol, and butanol; ketones such as acetone, diethyl ketone, and methyl ethyl ketone; esters such as methyl acetate, ethyl acetate, and butyl acetate; polyhydric alcohols such as propylene glycol, glycerin, and dipropylene glycol; ethers such as dipropylene glycol dimethyl ether, ethylene glycol dimethyl ether, ethylene glycol diethyl ether, propylene glycol dimethyl ether, and propylene glycol diethyl ether; monoether-moiety-containing glycols such as ethylene glycol monomethyl ether, ethylene glycol monoethyl ether, propylene glycol monomethyl ether, propylene glycol monoethyl ether, and dipropylene glycol monomethyl ether; cyclic ethers such as tetrahydrofuran, and dioxane; ether-moiety-containing esters such as propylene glycol monomethyl ether acetate, and propylene glycol monoethyl ether acetate.

The additive may be optionally added to the composition in order to adjust the viscosity or some other property of the diffusing agent composition. The additive is, for example, polypropylene glycol.

The above-mentioned diffusing agent composition can give a sufficient film thickness when painted onto a semiconductor substrate. Additionally, in a case where after the painting of the composition onto a substrate having steps, the substrate is fired to diffuse the diffusing component into the substrate, the resultant film can be restrained from being cracked.

Figure 1B:
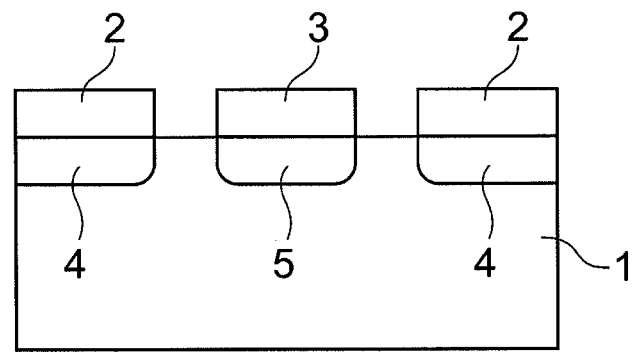
Figure 1C:
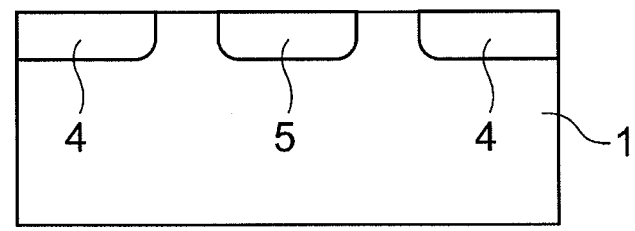

Method for Forming an Impurity Diffusion Layer, and Method for Producing a Solar Cell:

With reference to FIG. 1, a description is made about a method for forming an impurity diffusion layer, including the step of using an ink-jet method to jet out, onto an N-type semiconductor substrate, the above-mentioned diffusing agent composition which is a composition containing an N-type impurity diffusion component (C), thereby forming a pattern, and the step of diffusing the impurity diffusion component (C) in the diffusing agent composition into the semiconductor substrate; and a method for producing a solar cell having the semiconductor substrate on which the impurity diffusion layer is formed by this impurity-diffusion-layer-forming method. FIG. 1A to FIG. 1C are each a process sectional view referred to in order to describe the solar-cell-producing method, which includes the impurity-diffusion-layer-forming method according to this embodiment.

As illustrated in FIG. 1A, first, a diffusing agent composition 2 as described above, which contains an N-type impurity diffusion component (C), and a diffusing agent composition 3 containing a P-type impurity diffusion component are selectively painted onto an N-type semiconductor substrate 1 such as a silicon substrate. The diffusing agent composition 3, which contains the P-type impurity diffusion component, is prepared in a well-known way. The diffusing agent composition 3 is painted onto the whole of a surface of the semiconductor substrate 1 in a well-known way, for example, spin coating, and then a well-known means, such as an oven, and is used to dry the painted diffusing agent composition 3. A photolithographic method and an etching manner that are each well-known are used to form the diffusing agent composition 3 into a pattern form. An ink-jet method may be used to paint the diffusing agent composition 3 selectively onto a surface of the semiconductor substrate 1, thereby making a pattern.

The diffusing agent composition 2 is selectively painted onto the surface of the semiconductor substrate 1 in an ink-jet method, so as to be made into a pattern form. Specifically, from ink-jet nozzles of a well-known ink-jet machine, the diffusing agent composition 2 is jetted out onto regions of the semiconductor substrate 1 where an N-type impurity diffusion layer is to be formed, thereby making a pattern of the diffusing agent composition 2. After the formation of the pattern, a well-known means, such as an oven, is used to harden and dry the painted diffusing agent composition 2. The ink-jet machine may be an ink-jetting-out machine in a piezoelectric mode, wherein a piezoelectric element, which is deformable by receiving the application of a voltage, is used. The ink-jet machine may be an ink-jetting-out machine in a thermal mode, wherein bubbles generated by heating are used, or some other machine.

Next, as illustrated in FIG. 1B, the semiconductor substrate 1 patterned with the diffusing agent composition 2 and the diffusing agent composition 3 is set inside a diffusing furnace, such as an electric furnace, and then fired to diffuse the N-type impurity diffusion component (C) in the diffusing agent composition 2 and the P-type impurity diffusion component in the diffusing agent composition 3 from the surface of the semiconductor substrate 1 to the inside of the semiconductor substrate 1. By the radiation of a commonly-usable laser instead of the setting in the diffusing furnace, the semiconductor substrate 1 may be heated. In this way, the N-type impurity diffusion component (C) is diffused into the semiconductor substrate 1 to form an N-type impurity diffusion layer 4, and further the P-type impurity diffusion component is diffused into the semiconductor substrate 1 to form a P-type impurity diffusion layer 5.

Next, as illustrated in FIG. 1C, the oxide film formed on the surface of the semiconductor substrate is removed in a well-known etching manner. Through the above-mentioned steps, the impurity diffusion layers can be formed.

In the above-mentioned embodiment, the impurity diffusion layers are formed in the N-type silicon wafer; however, an impurity diffusion layer may be formed in a P-type silicon wafer. Moreover, in the embodiment, the ink-jet method is used to paint the impurity diffusing agent onto the semiconductor substrate surface, thereby forming the diffusing agent layers; however, a diffusing agent layer may be formed in any other manner, such as a spin coating, spray printing, roll coater printing, screen printing, letterpress printing, intaglio printing, or offset printing manner.

The invention is not limited to the above-mentioned embodiments, and various modifications, such as a design change, may be added thereto based on knowledge of those skilled in the art. It should be understood that any embodiment to which one or more of the modifications are added is also included in the scope of the invention.

EXAMPLES

Hereinafter, Examples of the invention will be described; however, these Examples merely exemplify the invention in order to describe the invention appropriately, and never limit the invention.

In Tables 1 to 4 are shown individual components of each of diffusing agent compositions used in Examples and Comparative Examples, and the content by percentage of each of the components. In these Examples, as a surfactant, an agent (SF8421EG; manufactured by Dow Corning Toray Co., Ltd.) was used. The content by percentage of a solvent is a value obtained by subtracting the respective contents by percentage of the other components from 100% by weight, which denotes the total proportion of each of the compositions, i.e., a value of the entire content by percentage of the balance.

TABLE 1

| | CONDENSATION PRODUCT (A) | | | CONDENSATION PRODUCT (B) | | $SiO_2$-CONVERTED MASS RATIO | | IMPURITY DIFFUSION COMPONENT (C) | |
|---|---|---|---|---|---|---|---|---|---|
| | STRUCTURE | wt % | $SiO_2$-CONVERTED MASS (wt %) | STRUCTURE | wt % | A | B | COMPONENT | CONTENT BY PERCENTAGE (wt %) |
| COMPARATIVE EXAMPLE 1 | | | | B-1 | 6.50 | 0.0 | 100.0 | $P_2O_5$ | 6.53 |
| COMPARATIVE EXAMPLE 2 | | | | B-1 | 6.50 | 0.0 | 100.0 | $P_2O_5$ | 11.19 |
| EXAMPLE 1 | A-1 | 7.53 | 4.67 | B-1 | 7.53 | 38.3 | 61.7 | $P_2O_5$ | 11.66 |
| EXAMPLE 2 | A-2 | 6.37 | 2.29 | B-1 | 6.37 | 26.5 | 73.5 | $P_2O_5$ | 10.11 |
| EXAMPLE 3 | A-3 | 6.37 | 3.57 | B-1 | 6.37 | 35.9 | 64.1 | $P_2O_5$ | 10.11 |
| EXAMPLE 4 | A-5 | 6.37 | 2.61 | B-1 | 6.37 | 29.1 | 70.9 | $P_2O_5$ | 10.11 |

| | P-ATOM-CONVERTED MASS (wt %) | $SiO_2$:PHOSPHORUS ATOMS | | SURFACTANT (ppm) | SOLVENT | FILM-FORMABILITY | CRACK RESISTANCE |
|---|---|---|---|---|---|---|---|
| | | $SiO_2$ | PHOSPHORUS ATOMS | | | | |
| COMPARATIVE EXAMPLE 1 | 2.85 | 69.5 | 30.5 | 500 | DPGM | C | C |
| COMPARATIVE EXAMPLE 2 | 4.88 | 57.1 | 42.9 | 500 | DPGM | B | C |
| EXAMPLE 1 | 5.09 | 70.6 | 29.4 | 500 | DPGM | A | A |
| EXAMPLE 2 | 4.41 | 66.3 | 33.7 | 500 | DPGM | A | A |
| EXAMPLE 3 | 4.41 | 69.3 | 30.7 | 500 | DPGM | A | A |
| EXAMPLE 4 | 4.41 | 67.1 | 32.9 | 500 | DPGM | A | A |

TABLE 2

| | CONDENSATION PRODUCT (A) | | | CONDENSATION PRODUCT (B) | | $SiO_2$-CONVERTED MASS RATIO | | IMPURITY DIFFUSION COMPONENT (C) | |
|---|---|---|---|---|---|---|---|---|---|
| | STRUCTURE | wt % | $SiO_2$-CONVERTED MASS (wt %) | STRUCTURE | wt % | A | B | COMPONENT | CONTENT BY PERCENTAGE (wt %) |
| COMPARATIVE EXAMPLE 3 | | | | B-1 | 6.50 | 0.0 | 100.0 | $B_2O_3$ | 4.27 |
| EXAMPLE 5 | A-1 | 7.35 | 4.56 | B-1 | 7.35 | 38.3 | 61.7 | $B_2O_3$ | 4.27 |

TABLE 2-continued

| | | | | | | | | | |
|---|---|---|---|---|---|---|---|---|---|
| COMPARATIVE EXAMPLE 4 | | | | B-1 | 13.00 | 0.0 | 100.0 | TRIOCTYL BORATE | 50.86 |
| EXAMPLE 6 | A-1 | 6.37 | 3.95 | B-1 | 6.37 | 38.3 | 61.7 | TRIOCTYL BORATE | 50.86 |
| EXAMPLE 7 | A-2 | 11.29 | 4.06 | B-1 | 6.37 | 39.0 | 61.0 | TRIOCTYL BORATE | 50.86 |
| EXAMPLE 8 | A-2 | 11.29 | 4.06 | B-1 | 6.37 | 39.0 | 61.0 | TRIOCTYL BORATE | 36.3 |

| | B-ATOM-CONVERTED MASS (wt %) | $SiO_2$:B ATOMS | | SURFACTANT (ppm) | SOLVENT | FILM-FORMABILITY | CRACK RESISTANCE |
|---|---|---|---|---|---|---|---|
| | | $SiO_2$ | B ATOMS | | | | |
| COMPARATIVE EXAMPLE 3 | 1.33 | 83.1 | 16.9 | 500 | DPGM | C | C |
| EXAMPLE 5 | 1.33 | 90.0 | 10.0 | 500 | DPGM | A | A |
| COMPARATIVE EXAMPLE 4 | 2.76 | 82.5 | 17.5 | 500 | DPGM | C | C |
| EXAMPLE 6 | 2.76 | 78.9 | 21.1 | 500 | DPGM | A | A |
| EXAMPLE 7 | 2.76 | 79.1 | 20.9 | 500 | DPGM | A | A |
| EXAMPLE 8 | 1.97 | 84.1 | 15.9 | 500 | DPGM | A | A |

TABLE 3

| | CONDENSATION PRODUCT (A) | | CONDENSATION PRODUCT (B) | | $SiO_2$-CONVERTED MASS RATIO | | IMPURITY DIFFUSION COMPONENT (C) | | P-ATOM-CONVERTED MASS (wt %) |
|---|---|---|---|---|---|---|---|---|---|
| | STRUCTURE | $SiO_2$-CONVERTED MASS (wt %) wt % | STRUCTURE | wt % | A | B | COMPONENT | CONTENT BY PERCENTAGE (wt %) | |
| EXAMPLE 9 | A-2 | 3.25 1.17 | B-1 | 9.75 | 10.7 | 89.3 | DIBUTYL PHOSPHATE | 29.95 | 4.41 |
| EXAMPLE 10 | A-2 | 6.50 2.34 | B-1 | 6.5 | 26.5 | 73.5 | DIBUTYL PHOSPHATE | 29.95 | 4.41 |
| EXAMPLE 11 | A-2 | 9.75 3.51 | B-1 | 3.25 | 51.9 | 48.1 | DIBUTYL PHOSPHATE | 29.95 | 4.41 |
| EXAMPLE 12 | A-2 | 20.00 7.20 | | | 100.0 | 0.0 | DIBUTYL PHOSPHATE | 46.07 | 6.79 |
| EXAMPLE 13 | A-2 | 11.25 4.05 | B-1 | 3.75 | 51.9 | 48.1 | DIBUTYL PHOSPHATE | 34.56 | 5.09 |
| EXAMPLE 14 | A-3 | 3.25 1.82 | B-1 | 9.75 | 15.7 | 84.3 | DIBUTYL PHOSPHATE | 29.95 | 4.41 |
| EXAMPLE 15 | A-3 | 6.50 3.64 | B-1 | 6.5 | 35.9 | 64.1 | DIBUTYL PHOSPHATE | 29.95 | 4.41 |
| EXAMPLE 16 | A-3 | 9.75 5.46 | B-1 | 3.25 | 62.7 | 37.3 | DIBUTYL PHOSPHATE | 29.95 | 4.41 |
| EXAMPLE 17 | A-3 | 18.00 10.08 | | | 100.0 | 0.0 | DIBUTYL PHOSPHATE | 41.46 | 6.11 |
| EXAMPLE 18 | A-3 | 6.5 3.64 | B-1 | 6.5 | 35.9 | 64.1 | DIBUTYL PHOSPHATE | 29.95 | 4.41 |
| EXAMPLE 19 | A-3 | 11.25 6.30 | B-1 | 3.75 | 62.7 | 37.3 | DIBUTYL PHOSPHATE | 34.56 | 5.09 |
| EXAMPLE 20 | A-3 | 18.00 10.08 | | | 100.0 | 0.0 | DIBUTYL PHOSPHATE | 49.76 | 7.33 |
| EXAMPLE 21 | A-3 | 11.25 6.30 | B-1 | 3.75 | 62.7 | 37.3 | DIBUTYL PHOSPHATE | 6.91 | 1.02 |
| EXAMPLE 22 | A-3 | 17.95 10.05 | | | 100.0 | 0.0 | DIBUTYL PHOSPHATE | 6.91 | 1.02 |
| EXAMPLE 23 | A-3 | 15.27 8.55 | B-1 | 1.5 | 85.1 | 14.9 | DIBUTYL PHOSPHATE | 13.82 | 2.04 |
| EXAMPLE 24 | A-3 | 25.52 14.29 | B-1 | 2.51 | 85.1 | 14.9 | DIBUTYL PHOSPHATE | 17.33 | 2.55 |
| EXAMPLE 25 | A-4 | 18 10.80 | | | | | DIBUTYL PHOSPHATE | 14.85 | 2.19 |
| EXAMPLE 26 | A-4 | 18 10.80 | | | | | DIBUTYL PHOSPHATE | 7.43 | 1.09 |

| | $SiO_2$:PHOSPHORUS ATOMS | | SURFACTANT (ppm) | SOLVENT | ADDITIVE | | FILM-FORMABILITY | CRACK RESISTANCE |
|---|---|---|---|---|---|---|---|---|
| | $SiO_2$ | PHOSPHORUS ATOMS | | | COMPONENT | CONTENT BY PERCENTAGE (wt %) | | |
| EXAMPLE 9 | 71.2 | 28.8 | 500 | DPGM | | | A | A |
| EXAMPLE 10 | 66.7 | 33.3 | 500 | DPGM | | | A | A |
| EXAMPLE 11 | 60.5 | 39.5 | 500 | DPGM | | | A | A |
| EXAMPLE 12 | 51.5 | 48.5 | 500 | DPGM | | | A | A |
| EXAMPLE 13 | 60.5 | 39.5 | 1500 | DPGM | | | A | A |
| EXAMPLE 14 | 72.4 | 27.6 | 500 | DPGM | | | A | A |
| EXAMPLE 15 | 69.7 | 30.3 | 500 | DPGM | | | A | A |
| EXAMPLE 16 | 66.4 | 33.6 | 500 | DPGM | | | A | A |
| EXAMPLE 17 | 62.3 | 37.7 | 500 | DPGM | | | A | A |
| EXAMPLE 18 | 69.7 | 30.3 | 3000 | DPGM | | | A | A |
| EXAMPLE 19 | 66.4 | 33.6 | 3000 | DPGM | | | A | A |
| EXAMPLE 20 | 57.9 | 42.1 | 1500 | DPGM | POLYPROPYLENE GLYCOL | 2 | A | A |

TABLE 3-continued

| | | | | | | |
|---|---|---|---|---|---|---|
| EXAMPLE 21 | 90.8 | 9.2 | 1500 | DPGM | A | A |
| EXAMPLE 22 | 90.8 | 9.2 | 1500 | DPGM | A | A |
| EXAMPLE 23 | 83.2 | 16.8 | 1500 | DPGM | A | A |
| EXAMPLE 24 | 86.8 | 13.2 | 1500 | DPGM | A | A |
| EXAMPLE 25 | 83.2 | 16.8 | 1000 | DPGM | A | A |
| EXAMPLE 26 | 90.8 | 9.2 | 1000 | DPGM | A | A |

In Tables 1 to 5, structures A-1, A-2, A-3 and A-4 are condensation products represented by the following chemical formulae, respectively:

[Chemical Formula 6]

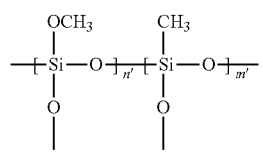

$n':m' = 20:80 \sim 50:50$

[Chemical Formula 7]

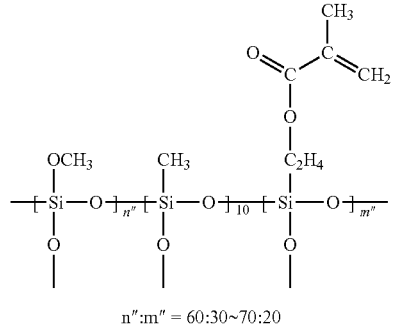

$n'':m'' = 60:30 \sim 70:20$

[Chemical Formula 8]

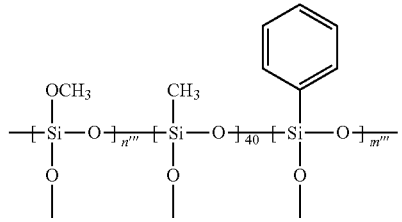

$n''':m''' = 40:20 \sim 50:10$

[Chemical Formula 9]

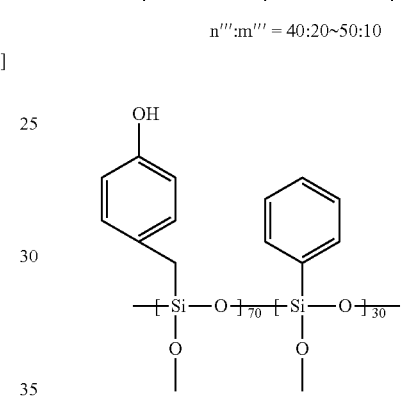

TABLE 4

| | CONDENSATION PRODUCT (A) | | CONDENSATION PRODUCT (B) | | SiO$_2$-CONVERTED MASS RATIO | | IMPURITY DIFFUSION COMPONENT (C) | |
|---|---|---|---|---|---|---|---|---|
| | STRUCTURE | wt % | SiO$_2$-CONVERTED MASS (wt %) | STRUCTURE | wt % | A | B | COMPONENT | CONTENT BY PERCENTAGE (wt %) |
| EXAMPLE 27 | A-3 | 11.25 | 6.30 | B-1 | 3.75 | 62.7 | 37.3 | DIBUTYL PHOSPHATE | 34.56 |
| EXAMPLE 28 | A-3 | 11.25 | 6.30 | B-1 | 3.75 | 62.7 | 37.3 | DIBUTYL PHOSPHATE | 20.74 |
| EXAMPLE 29 | A-3 | 11.25 | 6.30 | B-1 | 3.75 | 62.7 | 37.3 | DIBUTYL PHOSPHATE | 13.82 |
| EXAMPLE 30 | A-3 | 11.25 | 6.30 | B-1 | 3.75 | 62.7 | 37.3 | DIBUTYL PHOSPHATE | 6.91 |
| EXAMPLE 31 | A-3 | 17.95 | 10.05 | | | 100.0 | 0.0 | DIBUTYL PHOSPHATE | 20.74 |
| EXAMPLE 32 | A-3 | 17.95 | 10.05 | | | 100.0 | 0.0 | DIBUTYL PHOSPHATE | 13.82 |
| EXAMPLE 33 | A-3 | 17.95 | 10.05 | | | 100.0 | 0.0 | DIBUTYL PHOSPHATE | 6.91 |
| EXAMPLE 34 | A-3 | 15.27 | 8.55 | B-1 | 1.50 | 85.1 | 14.9 | DIBUTYL PHOSPHATE | 13.82 |
| EXAMPLE 35 | A-2 | 13.5 | 4.86 | B-1 | 3.75 | 56.4 | 43.6 | DIBUTYL PHOSPHATE | 13.82 |
| EXAMPLE 36 | A-2 | 20 | 7.20 | B-1 | 7.00 | 50.7 | 49.3 | DIBUTYL PHOSPHATE | 28.9 |
| EXAMPLE 37 | A-2 | 14.29 | 5.14 | B-1 | 7.00 | 42.4 | 57.6 | DIBUTYL PHOSPHATE | 24.77 |
| EXAMPLE 38 | A-2 | 14.29 | 5.14 | B-1 | 7.00 | 42.4 | 57.6 | DIBUTYL PHOSPHATE | 29.72 |
| EXAMPLE 39 | A-2 | 14.29 | 5.14 | B-1 | 7.00 | 42.4 | 57.6 | DIBUTYL PHOSPHATE | 19.82 |
| EXAMPLE 40 | A-2 | 11.43 | 4.11 | B-1 | 8.00 | 34.0 | 66.0 | DIBUTYL PHOSPHATE | 24.77 |
| EXAMPLE 41 | A-2 | 7.86 | 2.83 | B-1 | 8.25 | 25.5 | 74.5 | DIBUTYL PHOSPHATE | 22.6 |

TABLE 4-continued

| | P-ATOM-CONVERTED MASS (wt %) | SiO$_2$:PHOSPHORUS ATOMS | | SURFACTANT (ppm) | SOLVENT | FILM-FORMABILITY | CRACK RESISTANCE |
|---|---|---|---|---|---|---|---|
| | | SiO$_2$ | PHOSPHORUS ATOMS | | | | |
| EXAMPLE 27 | 5.09 | 66.4 | 33.6 | 500 | DPGM | A | A |
| EXAMPLE 28 | 3.06 | 76.7 | 23.3 | 500 | DPGM | A | A |
| EXAMPLE 29 | 2.04 | 83.2 | 16.8 | 500 | DPGM | A | A |
| EXAMPLE 30 | 1.02 | 90.8 | 9.2 | 500 | DPGM | A | A |
| EXAMPLE 31 | 3.06 | 76.7 | 23.3 | 500 | DPGM | A | A |
| EXAMPLE 32 | 2.04 | 83.2 | 16.8 | 500 | DPGM | A | A |
| EXAMPLE 33 | 1.02 | 90.8 | 9.2 | 500 | DPGM | A | A |
| EXAMPLE 34 | 2.04 | 83.2 | 16.8 | 500 | DPGM | A | A |
| EXAMPLE 35 | 2.04 | 80.9 | 19.1 | 500 | DPGM | A | A |
| EXAMPLE 36 | 4.26 | 76.9 | 23.1 | 500 | DPGM | A | A |
| EXAMPLE 37 | 3.65 | 76.9 | 23.1 | 500 | DPGM | A | A |
| EXAMPLE 38 | 4.38 | 73.5 | 26.5 | 500 | DPGM | A | A |
| EXAMPLE 39 | 2.92 | 80.6 | 19.4 | 500 | DPGM | A | A |
| EXAMPLE 40 | 3.65 | 76.9 | 23.1 | 500 | DPGM | A | A |
| EXAMPLE 41 | 3.33 | 76.9 | 23.1 | 500 | DPGM | A | A |

TABLE 5

| | CONDENSATION PRODUCT (A) STRUCTURE | CONDENSATION PRODUCT (B) STRUCTURE | SiO$_2$-CONVERTED MASS RATIO | | IMPURITY DIFFUSION COMPONENT (C) COMPONENT | SiO$_2$:PHOSPHORUS ATOMS | | SHEET RESISTIVITY ($\Omega/\square$) |
|---|---|---|---|---|---|---|---|---|
| | | | A | B | | SiO$_2$ | PHOSPHORUS ATOMS | |
| EXAMPLE 27 | A-3 | B-1 | 62.7 | 37.3 | DIBUTYL PHOSPHATE | 66.4 | 33.6 | 63 |
| EXAMPLE 28 | A-3 | B-1 | 62.7 | 37.3 | DIBUTYL PHOSPHATE | 76.7 | 23.3 | 123 |
| EXAMPLE 29 | A-3 | B-1 | 62.7 | 37.3 | DIBUTYL PHOSPHATE | 83.2 | 16.8 | 166 |
| EXAMPLE 30 | A-3 | B-1 | 62.7 | 37.3 | DIBUTYL PHOSPHATE | 90.8 | 9.2 | 280 |
| EXAMPLE 37 | A-2 | B-1 | 42.4 | 57.6 | DIBUTYL PHOSPHATE | 76.9 | 23.1 | 53 |
| EXAMPLE 40 | A-2 | B-1 | 34.0 | 66.0 | DIBUTYL PHOSPHATE | 76.9 | 23.1 | 42 |
| EXAMPLE 41 | A-2 | B-1 | 25.5 | 74.5 | DIBUTYL PHOSPHATE | 76.9 | 23.1 | 34 |

In Tables 1 to 5, structure A-5, structure B-1 and DPGM are as follows:
Structure A-5: organosiloxane (X-41-1056, manufactured by Shin-Etsu Chemical Co., Ltd.);
Structure B-1: hydrolyzate of Si(OC$_2$H$_5$)$_4$; and
DPGM: dipropylene glycol monomethyl ether.

Film-Formability Evaluation:

An ink-jetting printer (manufactured by Musashi Engineering, Inc.) was used to print each of the diffusing agent compositions of the examples and the comparative examples into the form of 5 pixel lines (width: 500 μm) (in a one-time painting manner) onto a semiconductor wafer subjected to specular working. The printing results were evaluated as follows: a case where a painted film having a thickness of 5000 Å or more was obtained was judged to be good ("A"); a case where a painted film having a thickness of 2000 Å or more and less than 5000 Å or more was obtained was judged to be poor ("B"); and a case where a painted film having a thickness of less than 2000 Å was obtained was judged to be inappropriate ("C").

As shown in Tables 1 to 4, about each of Examples each containing the condensation product (A), the film-formability evaluation result was judged to be good ("A"). By contrast, about each of Comparative Examples containing no condensation product (A), the result was judged to be poor ("B") or inappropriate ("C"). Accordingly, it is understood that the condensation product (A) contributes largely to an advantage that a sufficient painted film thickness is gained.

Crack Resistance Evaluation:

An ink-jetting printer (manufactured by Musashi Engineering, Inc.) was used to print each of the diffusing agent compositions of Examples and Comparative Examples onto a semiconductor wafer having steps each having a level difference of 3 μm. The resultant printed matter was fired at 950° C. to be subjected to diffusing treatment. After the firing and diffusing treatments, the resultant was checked with a microscope. A case where a crack was observed therein was judged to be inappropriate ("C"); and a case where no crack was observed therein was judged to be good ("A").

As shown in Tables 1 to 4, about each of Examples each containing the condensation product (A), the crack resistance evaluation result was judged to be good ("A"). By contrast, about each of the comparative examples containing no condensation product (A), the result was judged to be inappropriate ("C"). Accordingly, it is understood that the condensation product (A) contributes largely to an advantage that a sufficient crack resistance is gained.

Diffusing Performance Evaluation:

The diffusing performance was evaluated by measuring the sheet resistivity of a substrate after a substrate was subjected to a diffusing treatment. As the sheet resistivity is lower, the used composition is considered to be higher in diffusing performance. The diffusing agent compositions of each of Examples 27 to 30, 37, 40 to 41 were each painted onto a P-type Si substrate (face orientation: <100>, and resistivity: 5 to 15 Ω·cm) in a spin coating manner. The film thickness of the diffusing agent composition painted on the Si substrate was about 7000 Å. The composition-painted substrate was pre-baked at 100° C. and 200° C. for respective one minute, and then heated at 950° C. in a nitrogen atmosphere inside a heating furnace (VF-1000; manufactured by Koyo Thermo Systems Co., Ltd.) for 30 minutes. Thereafter, the Si substrate was immersed in a 5% HF solution in water for 10 minutes to remove the oxide film on any surface of the substrate. In each of Examples 27 to 30, the number of the samples was two. About each of the samples, the respective sheet resistivities at five positions were measured by a four-prove method (using a device (VR-70); manufactured by Hitachi Kokusai Electric Inc.). Thus, about each of Examples, the 10 sheet resistivities were obtained in total, and then the average of the 10 values was calculated out. The thus-obtained respective sheet resistivity averages are shown in Table 5. A sheet resistivity target value, which is varied in accordance with a use purpose and use conditions, is preferably 300Ω/□ or less, more preferably 150Ω/□ or less, most more preferably 100Ω/□ or less.

As shown in Table 5, it has been verified that there were used the diffusing agent compositions of Examples 27 to 30, which were common to each other in the structures and the components of the condensation product (A) those of the condensation product (B), and the component of the impurity diffusion component (C), but had varied contents by percentage of the impurity diffusion component (C), their sheet resistivity tended to be increased as the content by percentage of phosphorus atoms was decreased. The results of the present examples demonstrate that the composition of the invention is good in impurity diffusing performance. It has also been verified that when there were used the diffusing agent compositions of Examples 37, and 40 to 41, wherein the ratio of the total $SiO_2$-converted masses to the impurity-atom-converted mass was unvaried while the ratio of the $SiO_2$-converted mass of the condensation product (A) to that of the condensation product (B) was varied, their sheet resistivity tended to become lower as the proportion by mass of the condensation product (B) was higher.

What is claimed is:

1. A paintable diffusing agent composition used to diffuse an impurity diffusion component into a semiconductor substrate, comprising:

a condensation product (A) made from a starting material that is an alkoxysilane represented by the following general formula (1):

$$R^1{}_m Si(OR^2)_{4-m} \quad (1)$$

where $R^1$ and $R^2$ are an organic group,
a plurality of $R^1$s and $R^2$s included in condensation product are identical or different, and m is 0, 1 or 2, the condensation product including an alkoxysilane where m=0 also including at least one alkoxysilane where m is 1 or 2;
a condensation product (B) made from a starting material that is an alkoxysilane represented by the following general formula (3):

$$Si(OR^5)_4 \quad (3)$$

wherein
$R^5$ is an organic group, and may be the same or different
an impurity diffusion component (C); and
an organic solvent (D), and wherein
the condensation product (A) contains a structure represented by the following general formula (2):

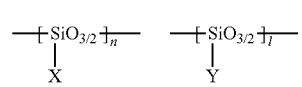

wherein X is an alkoxy group, Y is an organic group, and the ratio of n:l ranges from 95:5.
to 0:100; and wherein the ratio of the $SiO_2$-converted mass (A:B) of the condensation product (A) to that of the condensation product (B) is from 85:15 to 5:95.

2. The paintable diffusing agent composition according to claim 1, wherein
Y is an alkyl, aryl or epoxy group, or a group represented by —$R^3$—$R^4$, wherein
$R^4$ is an aryl group, or a group containing an ethylenically unsaturated double bond, and $R^3$ is an alkylene group having 1 to 9 carbon atoms, when each of a plurality of Xs or Ys may be the same or different from each other; and the structure may have $R^3$ different from each other.

3. The paintable diffusing agent composition according to claim 1, wherein
the impurity diffusion component (C) contains a compound of an element in the Group III or Group V.

4. The paintable diffusing agent composition according to claim 1, wherein
the ratio of the total of the $SiO_2$-converted mass of the condensation product (A) and that of the condensation product (B) to the impurity-atom-converted mass of the impurity diffusion component (C) ranges from 95:5 to 50:50.

* * * * *